(12) United States Patent
Ziglioli

(10) Patent No.: US 10,504,806 B2
(45) Date of Patent: Dec. 10, 2019

(54) SEMICONDUCTOR PACKAGE WITH ELECTRICAL TEST PADS

(71) Applicant: STMICROELECTRONICS S.R.L., Agrate Brianza (IT)

(72) Inventor: Federico Giovanni Ziglioli, Pozzo d'Adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 183 days.

(21) Appl. No.: 15/148,754

(22) Filed: May 6, 2016

(65) Prior Publication Data

US 2017/0323834 A1 Nov. 9, 2017

(51) Int. Cl.
*H01L 21/66* (2006.01)
*H01L 23/495* (2006.01)
*H01L 23/31* (2006.01)

(52) U.S. Cl.
CPC .......... *H01L 22/32* (2013.01); *H01L 23/3157* (2013.01); *H01L 23/4951* (2013.01); *H01L 2224/48091* (2013.01); *H01L 2224/48247* (2013.01); *H01L 2224/49175* (2013.01); *H01L 2224/97* (2013.01); *H01L 2924/181* (2013.01)

(58) Field of Classification Search
CPC ....................................................... H01L 21/66
See application file for complete search history.

(56) References Cited

U.S. PATENT DOCUMENTS

| 5,212,402 | A | * | 5/1993 | Higgins, III | ...... H01L 23/49572 257/532 |
| 5,656,864 | A | | 8/1997 | Mitsue et al. | |
| 5,767,527 | A | | 6/1998 | Yoneda et al. | |
| 2006/0197220 | A1 | | 9/2006 | Beer | |
| 2008/0242004 | A1 | | 10/2008 | Gulvin et al. | |
| 2011/0024890 | A1 | * | 2/2011 | Yang | ...................... H01L 21/486 257/686 |
| 2015/0162310 | A1 | | 6/2015 | Vincent et al. | |

FOREIGN PATENT DOCUMENTS

JP 2008196990 A * 8/2008

* cited by examiner

*Primary Examiner* — Marvin Payen
(74) *Attorney, Agent, or Firm* — Seed Intellectual Property Law Group LLP

(57) ABSTRACT

One or more embodiments are directed to semiconductor packages that include conductive test pads that are electrically coupled to, but distinct from, the leads of the package. In one embodiment the test pads are located on the plastic packaging material, such as encapsulation material, of the package and are electrically coupled to the leads of the package by traces. The traces may also be located on the packaging material and portions of the leads. In one embodiment, all of the test pads are located on a single surface of the packaging material of the package, which may allow for ease of electrical testing of the package.

11 Claims, 3 Drawing Sheets

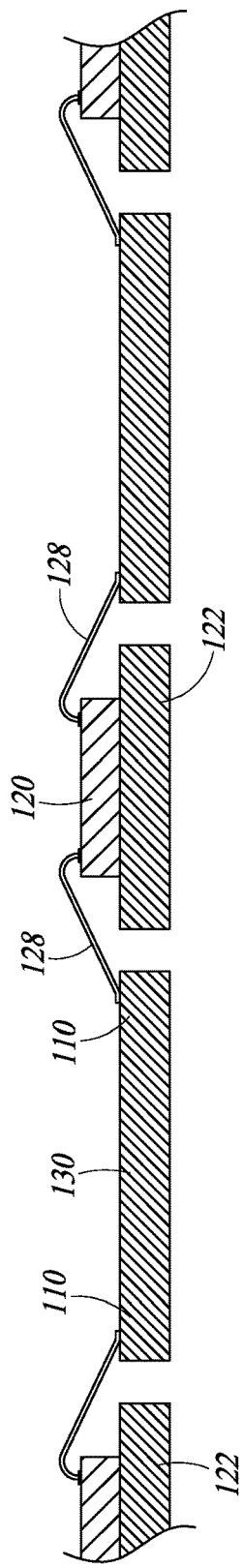
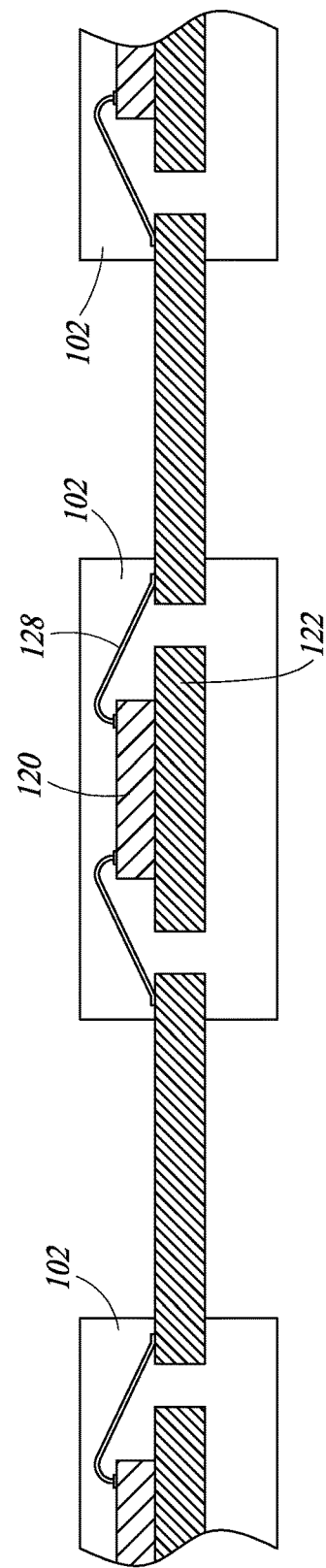
FIG. 2A
FIG. 2B

SEMICONDUCTOR PACKAGE WITH ELECTRICAL TEST PADS

BACKGROUND

Technical Field

One or more embodiments are directed to semiconductor packages and methods forming and electrically testing same.

Description of the Related Art

After semiconductor packages are formed, the package may undergo a quality assurance test, such as an electrical test. Generally described, the electrical test typically involves placing the package in a socket, which may be coupled to a Printed Circuit Board (PCB). The leads of the package are electrically coupled to contacts, such as contact pins or springs, of the socket. To electrically couple the contact pins with the leads of the package, a contact force is applied to the leads. In some cases the contact force is large enough to stress the package, which may result in damage to the lead, such as scratches, bending, cracking, breaking, etc. For instance, when leads are small or thin, the leads may also be weak, making damage more likely to occur. Unfortunately, damage to the leads during electrical testing can affect the performance of the package when package is then attached to a PCB for use in a product. That is, the leads are not able to provide adequate electrical coupling to the device or board to which it is attached in the product. Thus, there is an interest in conducting electrical testing of semiconductor packages that does not cause damage to the leads of the package.

BRIEF SUMMARY

One or more embodiments are directed to semiconductor packages that include conductive test pads that are electrically coupled to, but distinct from, the leads of the package. In one embodiment the test pads are located on the plastic packaging material, such as an encapsulation material, and are electrically coupled to the leads of the package by traces. The traces may also be located on the packaging material and portions of the leads. In one embodiment, all of the test pads are located on a single surface of the packaging material of the package, which may allow for ease of electrical testing of the package. In that regard, the package may be placed in a socket with the test pads facing the contact pins.

In one or more embodiments, the test pads and traces may be formed by ink jet technology, such as printed by Aerosol Jet® technology. In particular, after the package material has been formed, which typically involves a molding process, the test pads and traces are printed on the package material and the leads. In one embodiment, the traces and test pads are formed while a plurality of packages is connected together, such as by the package material or by connecting bars of a leadframe array or strip.

Although the test pads may be damaged in the electrical testing, the test pads are of suitable strength to withstand the procedure of electrical testing of the package. In some embodiments, the traces and/or test pads are removed from the package after the electrical testing of the package is complete. For instance, in one embodiment the traces and test pads may be removed by a laser.

BRIEF DESCRIPTION OF THE SEVERAL VIEWS OF THE DRAWINGS

FIGS. 2A-2D illustrate a plurality of semiconductor packages coupled together by a leadframe array or strip during various stages of manufacturing of the packages.

DETAILED DESCRIPTION

Figure 1A:
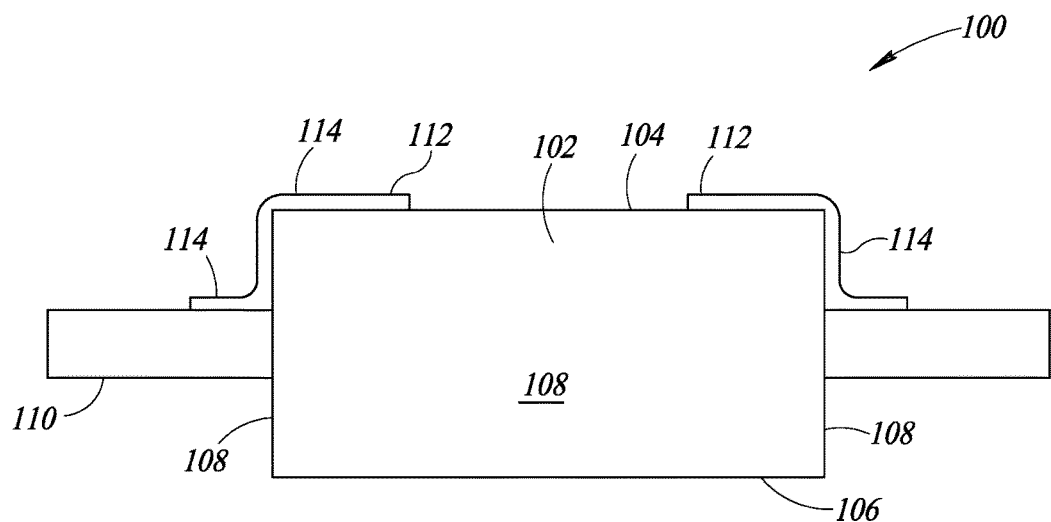
FIG. 1A is a side view of a semiconductor package in accordance with one embodiment.
Figure 1B:
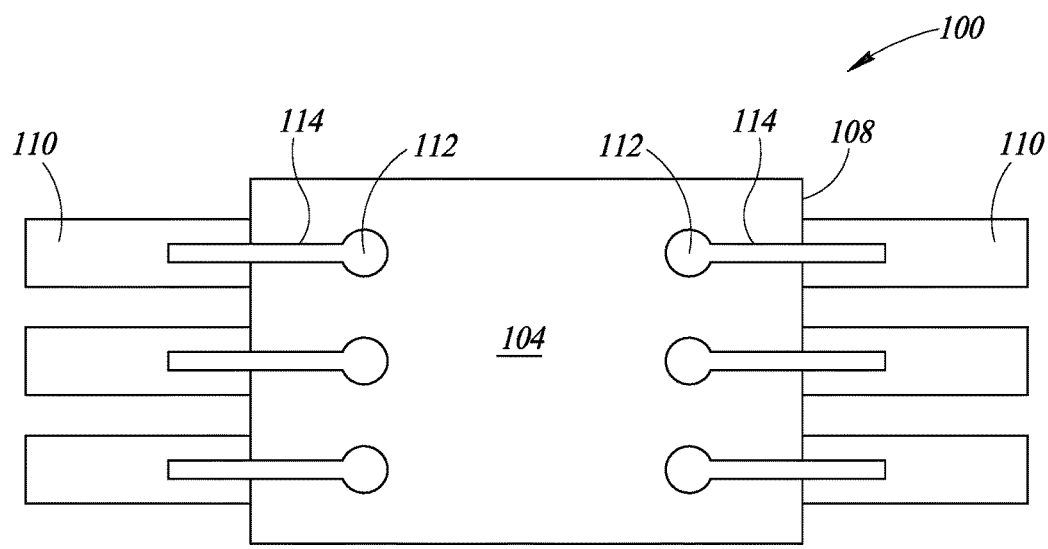
FIG. 1B is a plan view of the semiconductor package of FIG. 1A.

FIG. 1A is a side view of a semiconductor package 100 in accordance with one embodiment, while FIG. 1B is a plan view of the semiconductor package 100 of FIG. 1A. The semiconductor package 100 includes a plastic packaging material 102, such as encapsulation material, that covers or surrounds a semiconductor die (labeled 120 in FIG. 2B). The semiconductor die 120 is made from semiconductor material, such as silicon, and includes an active surface having one or more electrical components, such as integrated circuits, formed therein. The integrated circuits may be analog or digital circuits implemented as active devices, passive devices, conductive layers, and dielectric layers formed within the semiconductor die 120 and electrically interconnected according to the electrical design and function of the semiconductor die.

The packaging material 102 has upper, lower, and side surfaces 104, 106, 108. The packaging material 102 is an insulative material that protects the electrical components and materials from damage, such as corrosion, physical damage, moisture damage, or other causes of damage to electrical devices and materials. In one embodiment, the packaging material 102 is encapsulation material, which may be a molding compound, such as a polymer resin.

Leads 110 extend from opposing side surfaces 108 of the packaging material 102. Although three leads are shown as extending from two side surfaces of the packaging material, it will be understood to those skilled in the art that any number of leads may extend from any number of sides, including just one lead and side. Additionally, although not shown, outer ends of the leads 110 may bend downward so that the outer ends of the leads 110 are proximate or in the plane formed by the lower surface 106 of the packaging material 102. The leads 110 provide electrical communication for the semiconductor die 120 in the packaging material 102 to the external environment.

Conductive test pads 112 are located on the upper surface 104 of the packaging material 102. The upper surface 104 of the packaging material 102 is preferably a planar surface and is referred to as upper surface in view of the orientation in the figure itself. Thus, the semiconductor die 120 may be facing downward inside of the packaging material 102. As will be clear to persons of ordinary skill in the art, the test pads 112 may be formed on the lower or side surfaces 106, 108 of the packaging material 102.

The test pads 112 are electrically coupled to leads 110 by conductive lines or traces 114. That is, first ends of the traces 114 are coupled to the leads 110 and second ends of the traces 114 are coupled to the test pad 112. In particular, the first ends of the traces 114 are located on the leads 110, while the remaining portion of the traces 114 are located on the packaging material 102. In particular, the remaining portion of the traces 114 are located on the side surfaces 108 of the packaging material 102 and the upper surface 104 of the packaging material. As will be explained in more detail in reference to FIGS. 2A-2B, the test pads 112 and traces 114 may have been printed onto the packaging material 102 and leads 110.

The test pads 112, the traces 114, and the leads 110 are electrically coupled to one or more of the electrical components integrated in the semiconductor die 120. The test pads 112 and traces 114 may be any electrically conductive material, including but not limited to metal materials, such as gold, platinum, silver, nickel, copper and aluminum, and nonmetallic conductors, such as carbon nanotubes.

The test pads 112 are used to electrically test the package 100. In particular, the test pads 112 contact and electrically couple with components of an electrical tester, such as contact pins or springs of a socket. When the semiconductor package 100 is placed in a socket (not shown), the test pads 116 of the package 100 physically and electrically couple to the contact pins of the socket. In that regard, the test pads 112, rather than the leads 110, are exposed to the contact force caused by the contact pins of the socket. Thus, any damage that may occur due to the contact force from the socket does not damage the leads 110 but rather damages the test pads 112.

The test pads 112 have suitable dimensions for making an electrical connection with the contacts of the tester, such as the socket. In particular, the dimensions of the test pads 116 are any suitable amount depending on the size of the contact pins of the tester and the amount of contact force generated by the tester. That is, the test pads 112 are of suitable size to withstand the electrical test process of the package 100.

The dimensions of the traces 114 are any suitable amount to electrically couple the test pads 112 to the leads 110. Although not shown, the traces 114 may have the same width as the test pads 112. In some embodiments, the dimensions, including thicknesses or widths of the test pads 112 and/or the traces 114, may be as small as about 1.5 microns to 4 microns. The dimensions, however, may be larger, as desired. For instance, in one embodiment, the test pads 112 and the traces have widths or thicknesses up to 50 microns and may include a plurality of layers to form the test pads and/or traces.

Although the test pads 112 are shown as round in FIG. 1B, the test pads 116 may be any shape including rectangular, oval, oblong, or any other suitable shape. Additionally, the test pads 112 have suitable strength to withstand the contact force at least as long as it takes to test the package 100. In particular, the test pads 112 only have to have suitable strength to complete the electrical test, and thus in some cases may become damaged during the testing process.

The layout for the test pads 112 and traces 114 may differ from the layout of the leads 110. That is, the test pads 112 and leads 110 may have different pitches between them. In that regard, the test pads 112 may be spaced closer together or farther apart than the spacing between the leads 110. It is to be appreciated, however, that the layout of the test pads 112 and traces 114 will correspond to the contact pins of the sockets to be used for electrically testing the package 100. The traces 114 may have other shapes than shown. For instance, the traces 114 on the upper surface 104 may not be linear as is shown, but rather curved or turning at right angles to change the pitch between the test pads 112 relative to the pitch between the leads 110.

Figure 2C:
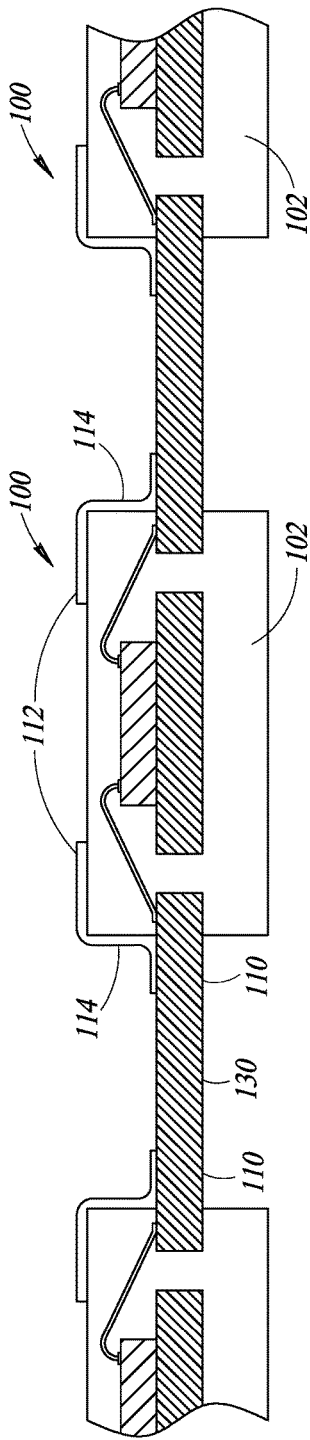

FIGS. 2A-2D illustrate various steps of a plurality of semiconductor packages 100 being formed. As shown in FIG. 2A, semiconductor dies 120 are coupled to die pads of a leadframe array or strip as is well known in the art. The leadframe array or strip includes die pads 122 and leads 110. The leadframe array or strip is made of one or more conductive materials, which may be a metal material, such as copper or a copper alloy. The leadframe array or strip may be preplated with one or more conductive materials as is well known in the art.

Figure 2D:
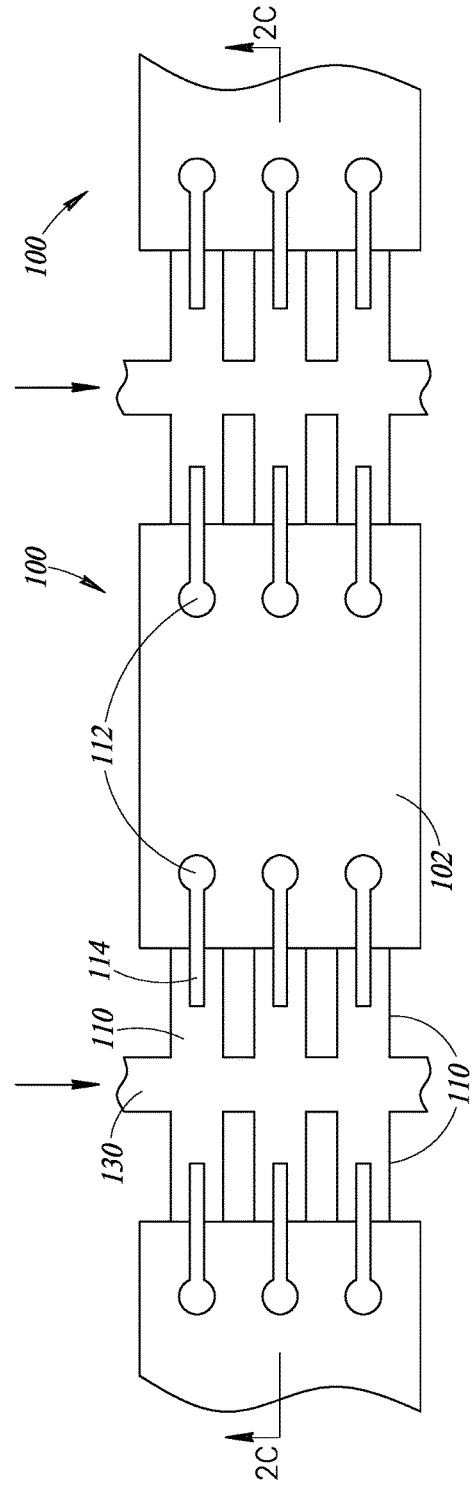

The leads 110 are coupled to each other by connecting bars 130 as shown in FIG. 2A and in the plan view of FIG. 2D. The die pads 122 may also be coupled to connecting bars (not shown).

The semiconductor die 120 are coupled to the die pads by providing, such as by dispensing, an adhesive material, such as tape, glue, paste, etc., on a surface of the die pad 122 and/or a back surface of the semiconductor dies 120, and the semiconductor dies 120 are placed on the die pad 122.

The semiconductor dies 120 are electrically coupled to the leads 110 by conductive wires 128. In particular, first ends of the conductive wires 128 are coupled to bond pads of the semiconductor die 120 and second ends of the conductive wires 128 are coupled to the leads 110. As is well known in the art, the bond pads are coupled to one or more integrated circuits of the semiconductor die.

Although not shown, the semiconductor die 120 may be coupled to the leads 110 by flip chip arrangement, as is well known in the art. In that regard, the leads 110 extend farther into the package material 102 and the semiconductor die 120 is located over and facing the leads 110, with solder bumps coupling them together. Thus, the package with a semiconductor die in a flip chip arrangement may not include the die pad.

As shown in FIG. 2B, packaging material 102 is formed around the semiconductor die 120, the conductive wires 128, and the die pad 122. The packaging material 102 may be formed in a molding process, which may include placing the leadframe strip or array as shown in FIG. 2A in a mold and injecting a molding compound, such as a resin molding compound, into the mold. The molding compound then hardens to form the packaging material 102. Hardening of the molding compound may involve a curing step. In one embodiment, a bottom surface of the die pad 122 remains exposed from the packaging material 102.

After the packaging material 102 has been formed, the test pads 112 and the traces 114 are formed on the packaging material 102 and the leads 110 as shown in FIGS. 2C and 2D. In particular, the test pads 112 and the traces 114 are printed on the packaging material 102 and the leads 110. In one embodiment the test pads 112 and the traces 114 are printed by ink printing technology, such as Aerosol Jet® technology, which is a maskless and contactless direct printing technology that can produce features with small dimensions. Aerosol Jet® technology allows for precisely deposited conductive materials with small dimensions. Generally described, Aerosol Jet® technology involves a conductive ink that is atomized. Aerosol and the atomized ink are provided to an impactor. In the impactor, the ink is densified and provided to one or more nozzles to print onto one or more surfaces.

The conductive ink is printed through one or more nozzles onto packaging material 102 and the leads 110 to form the test pads 112 and the traces 114 described above. The conductive ink may be printed on the upper surface 104 of the packaging material 102, the side surfaces 108 of the packaging material 102, and the leads 110 in a single printing step. That is, the printing step may include a single step for printing on two different planes of the package 100.

After the test pads and traces have been formed, the individual packages are singulated by cutting through the connecting bars 130 to separate the packages 100 into individual packages, as indicated by the arrows in FIG. 2D.

The packages may be singulated by any suitable method, including sawing, laser cutting, and scribe and break.

Upon singulation, the individual packages 100 may be electrically tested, such as in sockets. As mentioned above, the test pads 112 are used to test the package 100 rather than the leads 110. That is, during testing the test pads 112 are placed in contact with the contact pins of the socket. The contact force associated with the socket is applied to the test pads 112, rather than to the leads 110. Thus, with the leads 110 not being exposed to the contact force, the leads 110 will not be damaged during the testing procedure. Any damage that may occur due to the testing procedure occurs to the test pad 112.

In one embodiment, the test pads 112 and the traces 114 are removed from the packaging material 102 of the package 100 after the electrical testing is complete. For instance, the test pads 112 and the traces 114 may be removed by a laser.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package comprising:
    a semiconductor die;
    a plurality of leads, the semiconductor die electrically coupled to the plurality of leads;
    a packaging material around the semiconductor die and first portions of the plurality of leads, second portions of the plurality of leads extending from side surfaces of the packaging material;
    a plurality of test pads of conductive ink located directly on an outer exposed surface of the packaging material; and
    a plurality of traces of conductive ink having first ends on the second portions of the plurality of leads and second ends coupled to the plurality of test pads, portions of the plurality of traces being located directly on the packaging material.

2. The semiconductor package of claim 1, wherein the plurality of test pads are located on a planar surface of the packaging material.

3. The semiconductor package of claim 1, wherein the plurality of traces are located on two surfaces of the packaging material.

4. The semiconductor package of claim 3, wherein the two surfaces of the packaging material are at an acute or right angle of each other.

5. The semiconductor package of claim 1, wherein the plurality of traces have widths that are less than widths of the plurality of leads.

6. The semiconductor package of claim 1, wherein:
    the packaging material is molding compound;
    the plurality of test pads are located on a first planar surface of the molding compound; and
    each of the plurality of traces are located on the first planar surface of the molding compound and on a second planar surface of the molding compound.

7. The semiconductor package of claim 1, further comprising a die pad, the semiconductor die mounted to the die pad.

8. The semiconductor package of claim 1, wherein the plurality of test pads and the plurality of traces have thicknesses that are between 1.5 microns to 4 microns.

9. A semiconductor package comprising:
    a semiconductor die;
    a die pad, the semiconductor die mounted to the die pad;
    a plurality of leads, the semiconductor die electrically coupled to the plurality of leads;
    encapsulation material around the semiconductor die and first portions of the plurality of leads, second portions of the plurality of leads extending from side surfaces of the encapsulation material;
    a plurality of test pads of conductive ink located directly on an upper surface of the encapsulation material; and
    a plurality of traces of conductive ink coupling the second portions of the plurality of leads to the plurality of test pads, the plurality of traces being directly on second portions of the plurality of leads, side surfaces of the encapsulation material, and on an upper surface of the encapsulation material.

10. The semiconductor package of claim 9, wherein the plurality of test pads are located on a planar surface of the encapsulation material.

11. The semiconductor package of claim 9, wherein the plurality of test pads have a different pitch from the plurality of leads.

* * * * *